United States Patent
Chew et al.

(10) Patent No.: US 10,726,934 B2
(45) Date of Patent: Jul. 28, 2020

(54) MEMORY CHARACTERIZATION AND SUB-SYSTEM MODIFICATION

(71) Applicant: Micron Technology, Inc., Boise, ID (US)

(72) Inventors: Francis Chew, Boulder, CO (US); Bruce A. Liikanen, Berthoud, CO (US)

(73) Assignee: Micron Technology, Inc., Boise, ID (US)

(*) Notice: Subject to any disclaimer, the term of this patent is extended or adjusted under 35 U.S.C. 154(b) by 44 days.

(21) Appl. No.: 16/121,565

(22) Filed: Sep. 4, 2018

(65) Prior Publication Data

US 2020/0075118 A1    Mar. 5, 2020

(51) Int. Cl.
| | |
|---|---|
| *G11C 29/38* | (2006.01) |
| *G11C 29/44* | (2006.01) |
| *G11C 16/26* | (2006.01) |
| *G11C 11/56* | (2006.01) |

(52) U.S. Cl.
CPC .............. *G11C 29/38* (2013.01); *G11C 16/26* (2013.01); *G11C 29/44* (2013.01); *G11C 11/5642* (2013.01)

(58) Field of Classification Search
CPC ......... G11C 29/38; G11C 16/26; G11C 29/44; G11C 11/5642
See application file for complete search history.

(56) References Cited

U.S. PATENT DOCUMENTS

| | | | | |
|---|---|---|---|---|
| 8,482,978 | B1* | 7/2013 | Perlmutter | G11C 11/5642 365/185.03 |
| 9,703,494 | B1* | 7/2017 | Rajwade | G11C 11/5628 |
| 9,852,065 | B1* | 12/2017 | Rajwade | G11C 16/10 |
| 2010/0091535 | A1* | 4/2010 | Sommer | G11C 8/20 365/45 |
| 2010/0131827 | A1* | 5/2010 | Sokolov | G06F 11/1048 714/763 |
| 2014/0112076 | A1* | 4/2014 | Ish-Shalom | G11C 11/5642 365/185.18 |
| 2014/0112077 | A1* | 4/2014 | Ish-Shalom | G11C 16/20 365/185.18 |
| 2016/0092284 | A1* | 3/2016 | Shur | G06F 11/076 714/704 |
| 2016/0232919 | A1* | 8/2016 | Bradley | G10L 21/0216 |

(Continued)

*Primary Examiner* — Kyle Vallecillo
(74) *Attorney, Agent, or Firm* — Perkins Coie LLP

(57) ABSTRACT

A memory system can identify target memory units to characterize by generating Cumulative Distribution Function (CDF)-based data for each memory unit and analyzing the CDF-based data to identify target memory units that are exceptional. Such target memory units can be those with CDF-based data with extrinsic tails or that crosses an info limit threshold. The memory system can perform characterization processes for the target memory units, e.g. using an Auto Read Calibration (ARC) analysis or a Continuous Read Level Calibration (cRLC) analysis. A manufacturing process for the memory device can use results of the characterization processes, e.g. by mapping them to types of problems observed during testing. Alternatively, results of the characterization processes to can be used during operation of the memory device, e.g. to adjust the initial read voltage threshold, the read retry voltage values, or the order of read retry voltages used in data recovery.

20 Claims, 9 Drawing Sheets

(56) References Cited

U.S. PATENT DOCUMENTS

2017/0011803 A1* 1/2017 Baum .................... G11C 16/10
2017/0176497 A1* 6/2017 Wei ........................ B81B 1/008
2019/0335342 A1* 10/2019 Jacinto .............. H04W 28/0289

* cited by examiner

MEMORY CHARACTERIZATION AND SUB-SYSTEM MODIFICATION

TECHNICAL FIELD

The present disclosure generally relates to a memory sub-system, and more specifically, relates to characterizing elements of memory sub-systems and using the characterizations to perform various modifications for the memory sub-systems.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
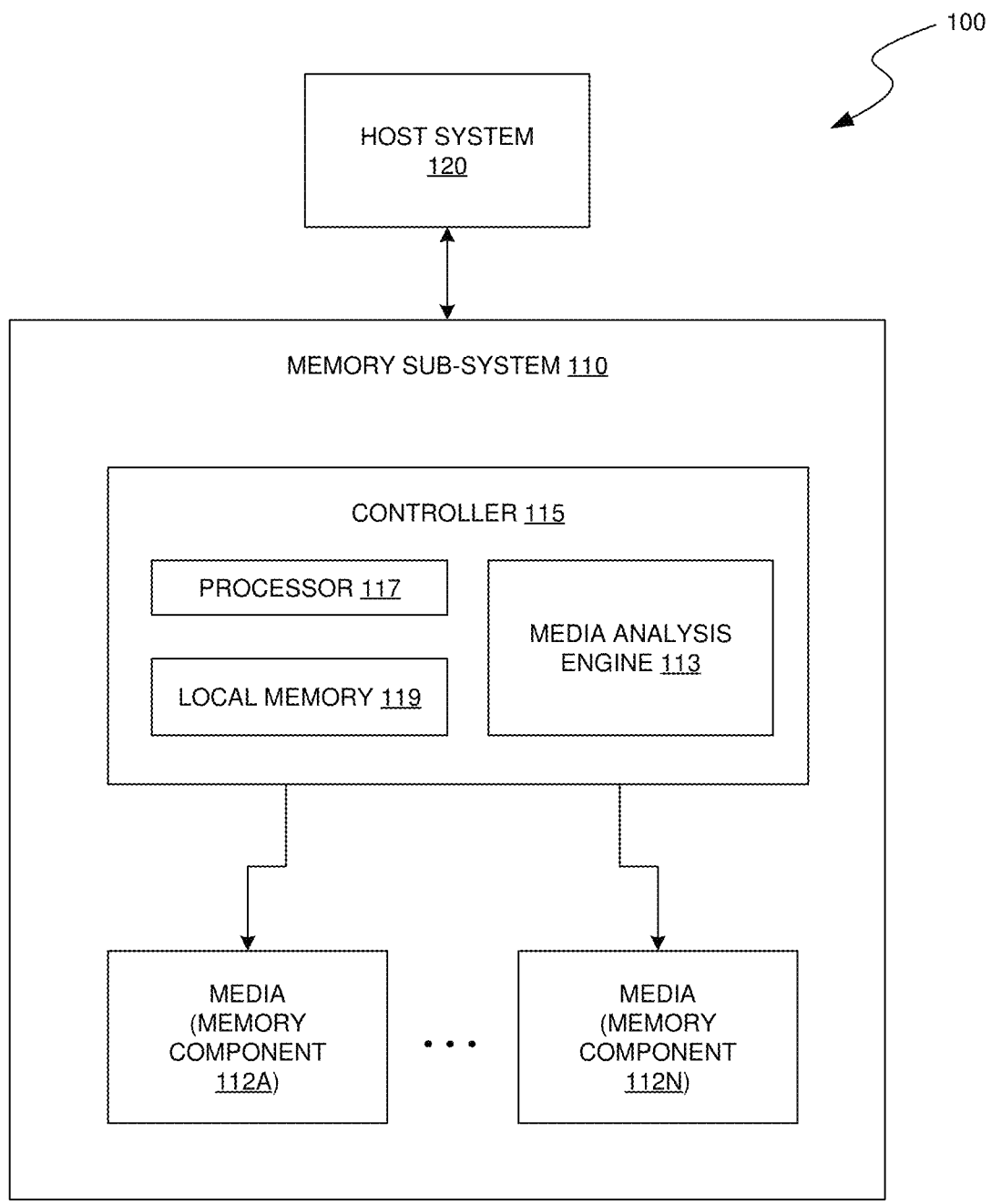
FIG. 1 illustrates an example computing environment that includes a memory sub-system in accordance with some embodiments of the present disclosure.

Aspects of the present disclosure are directed to a memory system for selecting and characterizing target memory units of a memory sub-system. A memory sub-system is also hereinafter referred to as a "memory device". An example of a memory sub-system is a storage system, such as a solid-state drive (SSD). In some embodiments, the memory sub-system is a hybrid memory/storage sub-system. In various implementations, a memory sub-system can include non-volatile memory components, such as, for example, negative-and (NAND). In general, a host system can utilize a memory sub-system that includes one or more memory components, which can be made of memory units, such as pages, blocks, planes, die, or groups thereof. While the technologies described herein generally refer to selecting and characterizing target memory units, in various implementations, the technologies can be used to selecting and characterizing target memory elements at different granularities, such as memory units (e.g. pages, blocks, planes, die, etc.), whole memory components (e.g. NAND components), whole memory devices (e.g. SSDs), or groups of memory devices. The host system can provide data to be stored at the memory sub-system and can request data to be retrieved from the memory sub-system.

The memory system can identify target memory units (e.g. pages) of a memory component to characterize. The memory system can identify the target memory units by generating CDF-based data based on error histograms for each memory unit of memory components in the memory device. The CDF-based data shows the tail distribution of the population, which can reveal the behavior of the worst performing memory units. The memory system can analyze the CDF-based data for each memory unit to identify memory units that may not exhibit normal operations (i.e. may be "exceptional"). For example, these target memory units can be the memory units with CDF-based data with extrinsic tails or that cross a pre-determined threshold, referred to herein as an "info limit" threshold.

The memory system can also perform a characterization process for the identified targets and use characterization results in the manufacturing or operation of the memory device. The memory system can characterize identified target memory units, e.g. to identify a more optimal read voltage threshold, a read error offset amount, or the shape or depth of "valleys" between voltage peaks stored in memory sub-systems. In various implementations, these characterizations can be performed using an Auto Read Calibration (ARC) analysis or a Continuous Read Level Calibration (cRLC) analysis. A manufacturing process for the memory device can use results of the characterization processes, e.g. by mapping them to types of manufacturing problems pertaining to test fallout. Alternatively, results of the characterization processes can be used during operation of the memory device, e.g. to adjust initial read threshold voltages, the read retry voltage values, or the order of read retry steps (e.g. with corresponding voltages) used in data recovery.

Memory system testing, such as for manufacturing and operation performance, have historically instituted simple pass or fail criteria. Such tests provide very limited ability to make early identifications (e.g. during manufacturing or prior to entering failure conditions) of memory units that merit further analysis. This results in an inadequate ability to identify problems with memory sub-systems and to adjust for more optimal operation.

Aspects of the present disclosure address the above and other deficiencies by using CDF-based data illustrative of memory errors in memory units to identify nuanced aspects of the memory units. By characterizing memory units identified as targets such as in terms of valley offsets, particularly weak units, etc., can provide feedback to memory system manufacturing and system error recovery. For example, this characterization can be used in a data-driven method to set read threshold voltages or read retry table offsets, thereby increasing the probability of early successful reads and lowering the overall performance cost for error recovery.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

A media analysis engine 113 can be used to identify target memory units, perform characterization on the target memory units, and use the characterization results to adjust manufacturing or device operation procedures. In some embodiments, the controller 115 includes at least a portion of the media analysis engine 113. For example, the controller 115 can include a processor 117 (processing device) configured to execute instructions stored in local memory 119 for performing the operations described herein. In some embodiments, the media analysis engine 113 is part of the host system 110, an application, or an operating system.

The media analysis engine 113 can receive sets of characteristics associated with memory units of memory components 112A to 112N of the memory sub-system 110. The media analysis engine 113 can identify target memory units by selecting the memory units that have CDF-based data that crosses an info limit threshold or that exhibits an extrinsic tail. The media analysis engine 113 can characterize the selected target memory units by performing an Auto Read Calibration (ARC) procedure or a Continuous Read Level Calibration (cRLC) procedure. The media analysis engine 113 can map the results of the characterization to a corresponding expected problem, which can be associated with a corresponding manufacturing action. Alternatively or in addition, results of the characterization processes can be used during operation of the memory device, e.g. to adjust the read threshold, the read retry list values, or order of read retry voltages used in data recovery. Further details with regards to the operations of the media analysis engine 113 are described below.

Figure 2:
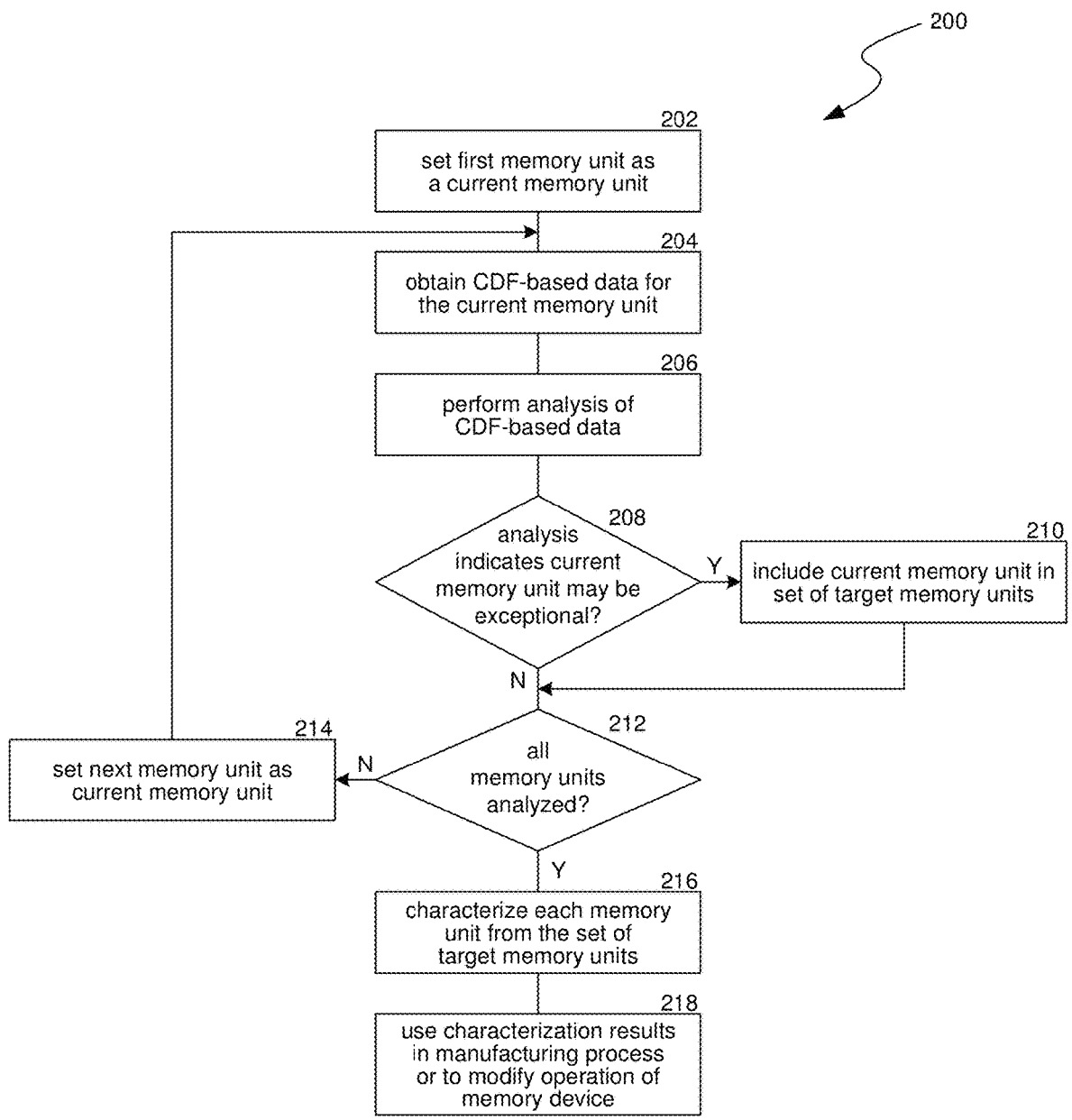
FIG. 2 is a flow diagram of selecting and characterizing target memory units of a memory sub-system to modify the memory sub-system, in accordance with some embodiments of the present disclosure.

FIG. 2 is a flow diagram of an example method 200 for selecting and characterizing target memory units of a memory sub-system to modify the memory sub-system, in accordance with some implementations of the present technology. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the media analysis engine 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 202, the processing logic can set a first memory unit of a memory component as a current memory unit. In various implementations, the processing logic selects a set of target memory units from among all the memory units of a memory device or from among a sub-set of the all the memory units of a memory device. For example, the processing logic can select from a random sub-set, a sub-set that includes memory units from a variety of areas (e.g. from particular memory components) within the memory device, a sub-set that targets a particular area of the memory device (e.g. an area suspected of excess wear), or a sub-set that selects memory components from each of a higher granularity of memory elements (e.g. selecting three random pages from each block of a memory component, or across memory components of a memory device).

At block 204, the processing logic can obtain CDF-based data for the current memory unit selected at block 202 or, in successive iterations, at block 214. The CDF-based data can be generated using quality measures, such as a histogram of errors per memory item (e.g. code word or other memory item). The quality measures can be converted into cumulative distribution function (CDF)-based data. CDF-based data is data that incorporates the CDF function of a set of data, where the CDF is the function whose value is the probability that a corresponding continuous random variable has a value less than or equal to a given value. For example, in terms of error measures of code words in memory, the CDF-based data can specify, for a given amount of errors, the frequency of code words that are expected to have no more than that amount of errors. In some implementations, the CDF-based data can be 1-CDF, where the CDF is implemented based on the histogram.

At block 206, the processing logic can perform an analysis of the CDF-based data obtained at block 204. In various implementations, this analysis can include one or both of determining whether the graph of the CDF-based data crosses a specified x-axis value (i.e. an "info limit threshold") or whether the CDF-based data exhibits an "extrinsic tail."

An extrinsic tail can be identified using a projection of the CDF-based data. As used herein, a projection can be determined in various ways. In some implementations, the projection of the CDF-based data can be a best fit of the CDF-based data to a linear function. In some implementations, other modeling techniques can be used to determine the projection, such as using a function of a different degree, using the average of CDF-based data from other memory devices, or applying a machine learning algorithm to the CDF-based data or data of other memory devices to predict next data points from previous data points of the CDF-based data. In some implementations, the projection can be based on a portion of the CDF-based data, e.g. only the portion past ten on the x-axis. An extrinsic tail can be identified by comparing the projection to the actual CDF-based data and determining if a variance at higher error rate values deviates from the projection is above a specified threshold variance level. In some implementations, this comparison can determine whether there is a sufficient match between the projection of the CDF-based data and the actual CDF-based data by determining if the difference between the two at any point is above a threshold. In other implementations, this determination can be based on a comparison of an average difference of all points within a window. For example, the processing logic can determine the difference between the projection of the CDF-based data and the actual CDF-based data for each point on the x-axis that are within 5 error units of each other, and determine if the average of these differences is above a threshold. In some implementations, the processing logic may only use points above a particular value, e.g. by excluding points that were excluded for the fitting the projection to the CDF-based data. Example data for identifying an extrinsic tail is discussed below in relation to FIG. 4A.

In some cases where the processing logic makes a comparison to an info limit threshold, the comparison can determine whether the graph of the CDF-based data crosses the info limit at any point (e.g. if, given all the code words in a memory element, there is expected to be at least the info limit threshold amount of errors). In other cases where the processing logic makes a comparison to an info limit threshold, the comparison can determine whether the graph of the CDF-based data crosses the info limit before a specified y-axis threshold. For example, given the y-axis threshold of 0.00001 (i.e. a probability of 1 in 10,000 code words having at least a given number of bits in error) and an info limit threshold of 75 bits in error per code word, the processing logic can determine whether the CDF-based data indicates whether the memory component is expected to have least 1 in every 10,000 code words with at least 75 bits in error.

In some implementations, the info limit can be set based on multiple previous analyses of CDF-based data, where an info limit threshold can be set across the CDF-based data instances such that, in general, memory units with undesired behavior have CDF-based data that crosses the info limit threshold while memory units without undesired behavior have CDF-based data that does not cross the info limit threshold. For example, the info limit threshold can be set using a parameter optimization approach to determine amounts of memory units with undesired behavior that can be mapped to corresponding causes. Example data for making a comparison to an info limit threshold is discussed below in relation to FIG. 4B.

At block 208, the processing logic can determine whether the analysis at block 208 indicated the current memory unit is exceptional, e.g. whether the graph of CDF-based data crossed an info limit threshold or had an extrinsic tail. If so, the processing logic can continue to block 210. If not, the processing logic can continue to block 212. At block 210, the processing logic can include the current memory unit in a set of target memory units to be characterized at block 216.

At block 212, the processing logic can determine whether all the memory units of the memory component (or of multiple memory components) have been analyzed by process 200. As discussed above in relation to block 202, the memory units can be the memory units of a memory component, the units of all the memory components of a memory device, or a selected sub-set of memory units across a memory component or memory device. If all the memory units have been analyzed by process 200, the processing logic can continue to block 216. If not, the processing logic can continue to block 214, where the next memory unit of the memory device can be set as the current memory unit for analysis via blocks 204-212.

At block 216, the processing logic can characterize each of the memory units in the set of target memory units. Characterizing the memory units can be performed by profiling a distribution of voltages in the memory unit, e.g. how wide or tall each peak or valley is in a graph of the distributions, how evenly spaced they are, how far from an expected x-axis position each valley is, etc. In various implementations, characterizing a memory unit can include performing an Auto Read Calibration (ARC) procedure and/or a Continuous Read Level Calibration (cRLC) procedure. An ARC procedure can include reading at a valley (corresponding to a memory unit such as an upper, lower, or extra page) starting at an initial read threshold voltage, iterating reads using successively larger and smaller read voltages, and interpolating a perceived optimal read threshold for the memory unit. Additional details for performing an ARC procedure are provided below in relation to FIGS. 3A and 5A. A cRLC procedure can include executing a 3-read sample for a valley and, based on bit error counts, determining if a better result is achieved by shifting the read offset. This process can be repeated until convergence occurs, which can be the cRLC result. The cRLC can also use a difference error count (DiffEC) to profile a shape of each valley. Additional details for performing an cRLC procedure are provided below in relation to FIGS. 3B and 5B. In some implementations, the results of the characterizations can be logged with additional data regarding the corresponding memory unit, such as temperature measurements, number of operations performed on that memory unit, area of the memory device the memory unit is in, etc.

The analysis at block 216 can be performed for each expected valley of a graph, where the graph can be of distribution counts (y-axis) given particular voltages (x-axis) for pages in a memory component. The analysis can include a characterization for each valley, e.g. using ARC or cRLC (see e.g. FIGS. 5A and 5B). In various implementations, these characterizations can be stored at different granularities, e.g. for each valley, for groups of valleys where the processing logic groups similar valleys such as according to identified valley types, or for all the valleys of a memory element. The memory element, for example, can be the whole memory device, one or more memory components, or one or more memory units (e.g. die, plane, block, page, etc.). Where a single characterization is stored for a set of multiple valleys, the characterization can be an aggregation of the characterizations for each valley in the set, e.g. by taking averages of corresponding characterization values.

At block 218, the processing logic can use results of the characterization, from block 216, in the manufacturing of the memory device, to modify operation of the memory device, or both. The results can be used in manufacturing of the memory device by mapping the characterization from block 216 to inferences about the device. For example, the characterizations can identify a magnitude and shift for read voltages which can be mapped to causes expected to produce that magnitude and shift in voltage. In some implementations, the inferences can be a performance characteristic for the device. Thus, devices can be allocated or marketed for particular purposes consistent with that device's performance characteristic. In some cases, the inferences can be mapped to corrective actions, such as reordering error recovery steps in a particular way, applying initial read voltage thresholds for particular memory units, adjusting an amount of voltage change that occurs during a read retry for memory units, replacing low performance memory elements, etc.

In some implementations, the characterizations can be used to modify the operation of a previously manufactured memory device. For example, modifications can include reordering error recovery steps, applying different initial read voltage thresholds, adjusting the amount of voltage change that occurs during a read retry, etc. As a more specific example, the characterizations can include inferences of optimal read offsets for a particular portion of a page, which can then be used as the initial read voltage for that portion of the page, reducing how much error correction will be required in future read operations.

As discussed above, analysis results can be for different granularities (e.g. each valley, for sets of valleys that have a particular type, or for sets of valleys in a memory element). As a result, whether used in manufacturing or in operation, the uses of the results at block 218 can be performed at a corresponding level of granularity. For example, an initial read voltage, read retry offsets, or error correction sequence can be set for each valley, for each valley type, or for sets of valleys.

Figure 3A:
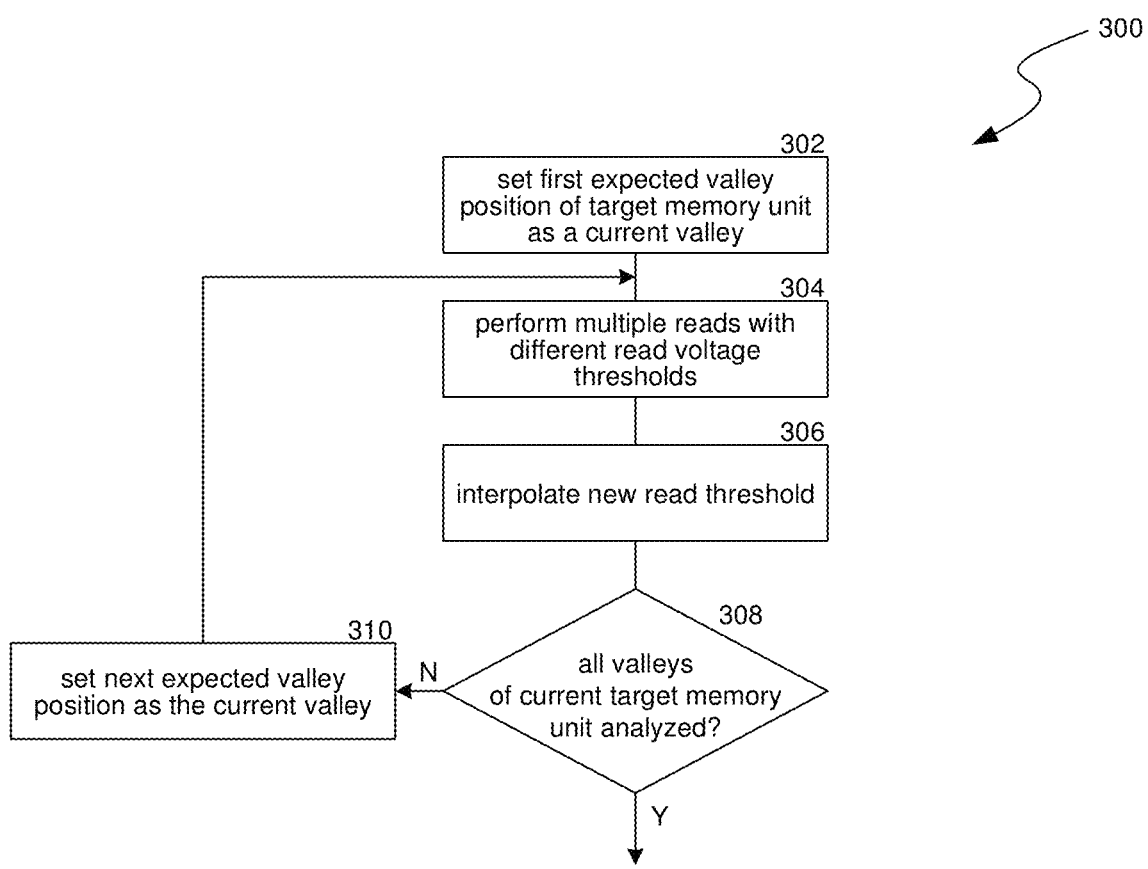
FIG. 3A is a flow diagram of characterizing a target memory unit using an Auto Read Calibration (ARC) procedure, in accordance with some embodiments of the present disclosure.

FIG. 3A is a flow diagram of an example method 300 for characterizing a target memory unit using an Auto Read Calibration (ARC) procedure, in accordance with some implementations of the present technology. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the media analysis engine 113 of FIG. 1. In some embodiments, the method 300 is performed as a sub-process of block 216. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Method 300 can be performed in relation to a set expected valley positions of a memory unit (e.g. a page), where each expected valley corresponds to a previously calibrated read voltage threshold for the portion of the memory unit. For example, a memory unit can have seven expected valley positions, for the separations between eight peaks (e.g. peaks 502 and 504 in FIG. 5A). In some implementations, each valley can be part of a lower page, upper page, or extra page. A graph resulting from read attempts can have read voltages on the x-axis and distribution counts on the y-axis. A read can occur with an initial read voltage and when a returned value is not an expected value, read retries can occur iteratively trying read voltages further above and below the initial read voltage.

Figure 5A:
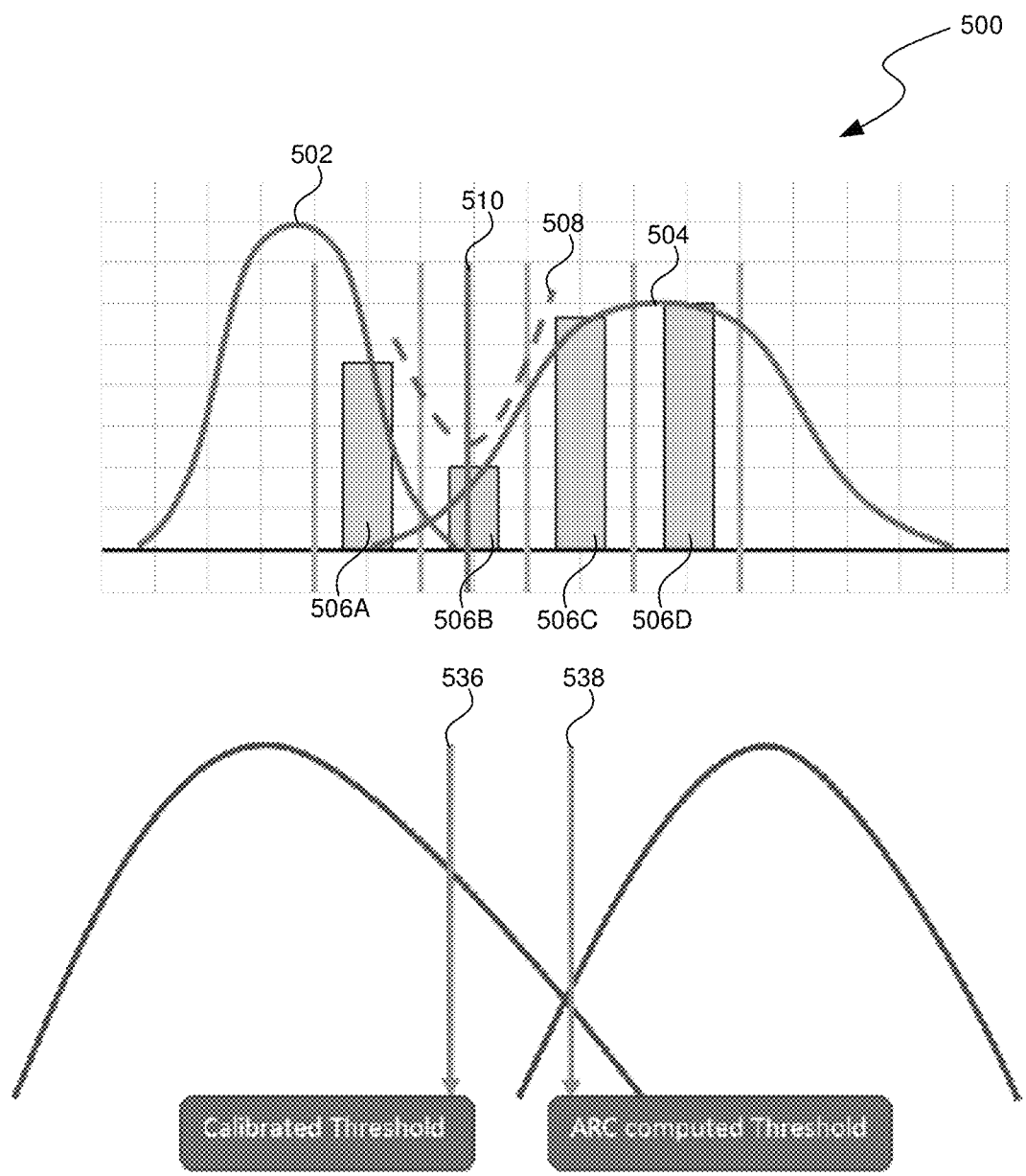
FIG. 5A is a conceptual diagram of data produced during an ARC procedure, in accordance with some embodiments of the present disclosure.

At block 302, the processing logic for method 300 can set a first expected valley position (e.g. a previously calibrated read voltage threshold, such as calibrated threshold 536 in FIG. 5A) for a memory unit as the current valley for analysis. At block 304, the processing logic can perform multiple reads, with different read voltage thresholds. Results of the multiple reads can be used to generate a histogram, e.g. bars 506A-D in FIG. 5A.

At block 306, the processing logic can interpolate a new read threshold based on the results from the multiple reads. For example, the histogram can be converted into a curve (e.g. curve 508) fitted to the heights of the histogram bars (e.g. bars 506A-D). The processing logic can identify the new read threshold (e.g. at new read threshold 510) at the lowest point on the fitted curve. The processing logic can provide the new read threshold as a shift direction and magnitude of shift from the previously calibrated read threshold. For example, new read threshold 538 can be provided for use as compared to previously calibrated read threshold 536. New read threshold voltage 510 is shown in a different example from new read threshold voltage 538, as these thresholds were generated from different valleys.

At block 308, the processing logic can determine whether all the expected valley positions of the memory unit being have been analyzed. If not, the processing logic can proceed to block 310, where it can set the next expected valley position as the current valley for analysis by blocks 304 and 306. If so, the processing logic can store the results and end. In some implementations, the results can be stored for each valley, for valleys grouped according to identified valley types, or for subsets of the memory unit, or for subsets of memory units across of a memory component or components of a memory device (e.g. per page, per block, etc.). Where a result is stored for multiple valleys, the result can be generated by aggregating values determined for the multiple valleys, e.g. by taking averages.

Figure 3B:
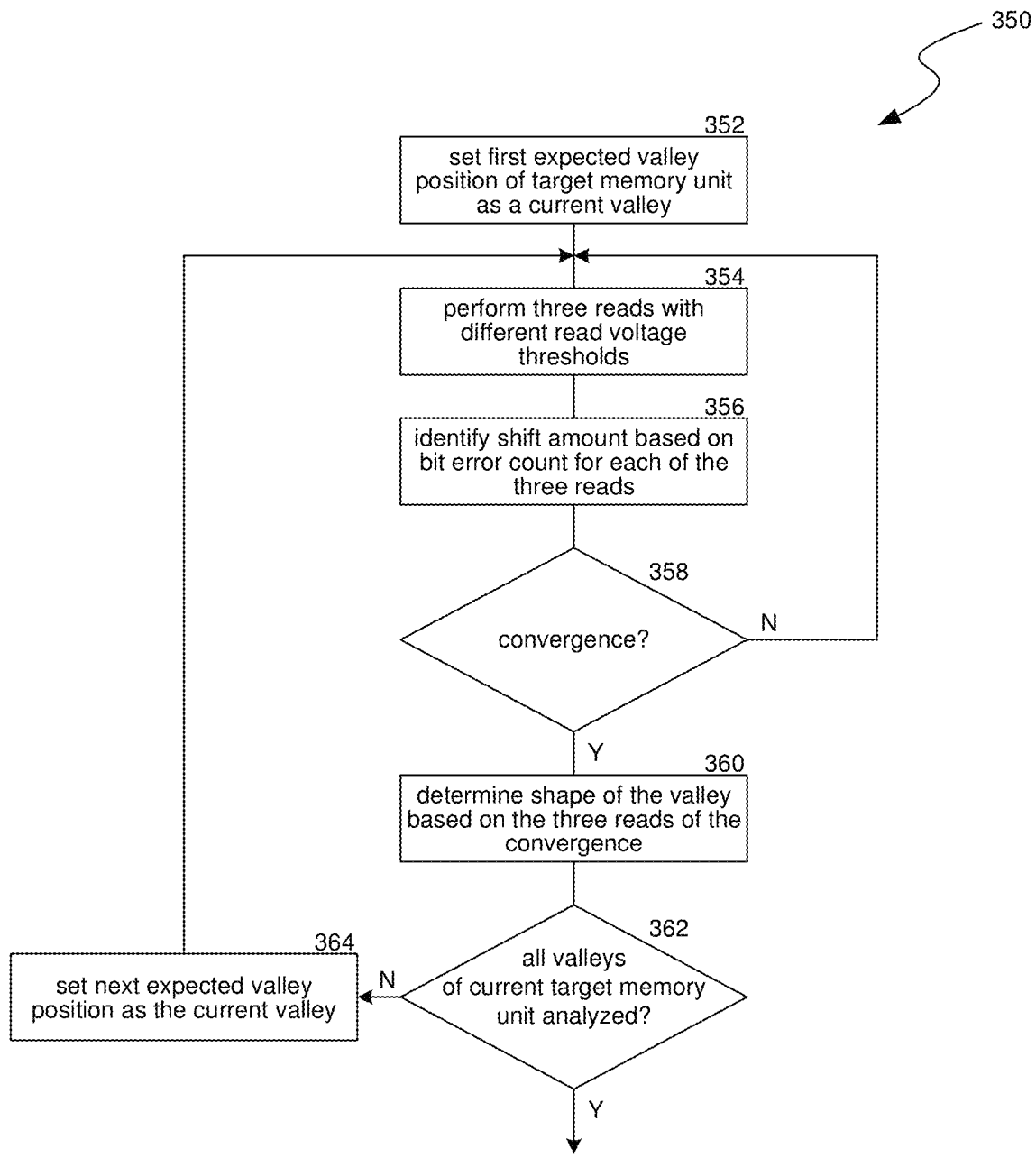
FIG. 3B is a flow diagram of characterizing a target memory unit using a Continuous Read Level Calibration (cRLC) procedure, in accordance with some embodiments of the present disclosure.

FIG. 3B is a flow diagram of an example method 350 for characterizing a target memory unit using a Continuous Read Level Calibration (cRLC) procedure, in accordance with some implementations of the present technology. The method 350 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 350 is performed by the media analysis engine 113 of FIG. 1. In some embodiments, the method 350 is performed as a sub-process of block 216. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Similarly to method 300, method 350 can be performed in relation to a set expected valley positions of a memory unit (e.g. a page), where each expected valley corresponds to a previously calibrated read voltage threshold for the portion of the memory unit. At block 352, method 350 can set a first expected valley position (e.g. a previously calibrated read voltage threshold) as the current valley to characterize using blocks 354-360.

At block 354, the processing logic for method 350 can perform a set of read operations (e.g. three read operations) that begin at different initial read voltage thresholds, centered around the current valley. At block 356, the processing logic can identify a shift amount and direction based on the bit error count for each of the set of read operations. At block 358, the processing logic can determine if convergence has been reached as compared to one or more previous iterations of blocks 354-358 for the current valley. In some implementations, convergence will be considered reached when the shift amount and direction identified at block 356 has not changed above a threshold amount from the previous iteration for the current valley, or when the variance among a most recent specified number of iterations (e.g. two iterations) of blocks 354-358, for the current valley, is below a threshold amount. The processing logic can return to block 354 from block 358 until convergence is reached. Once convergence is reached, the processing logic can continue to block 360.

Figure 5B:
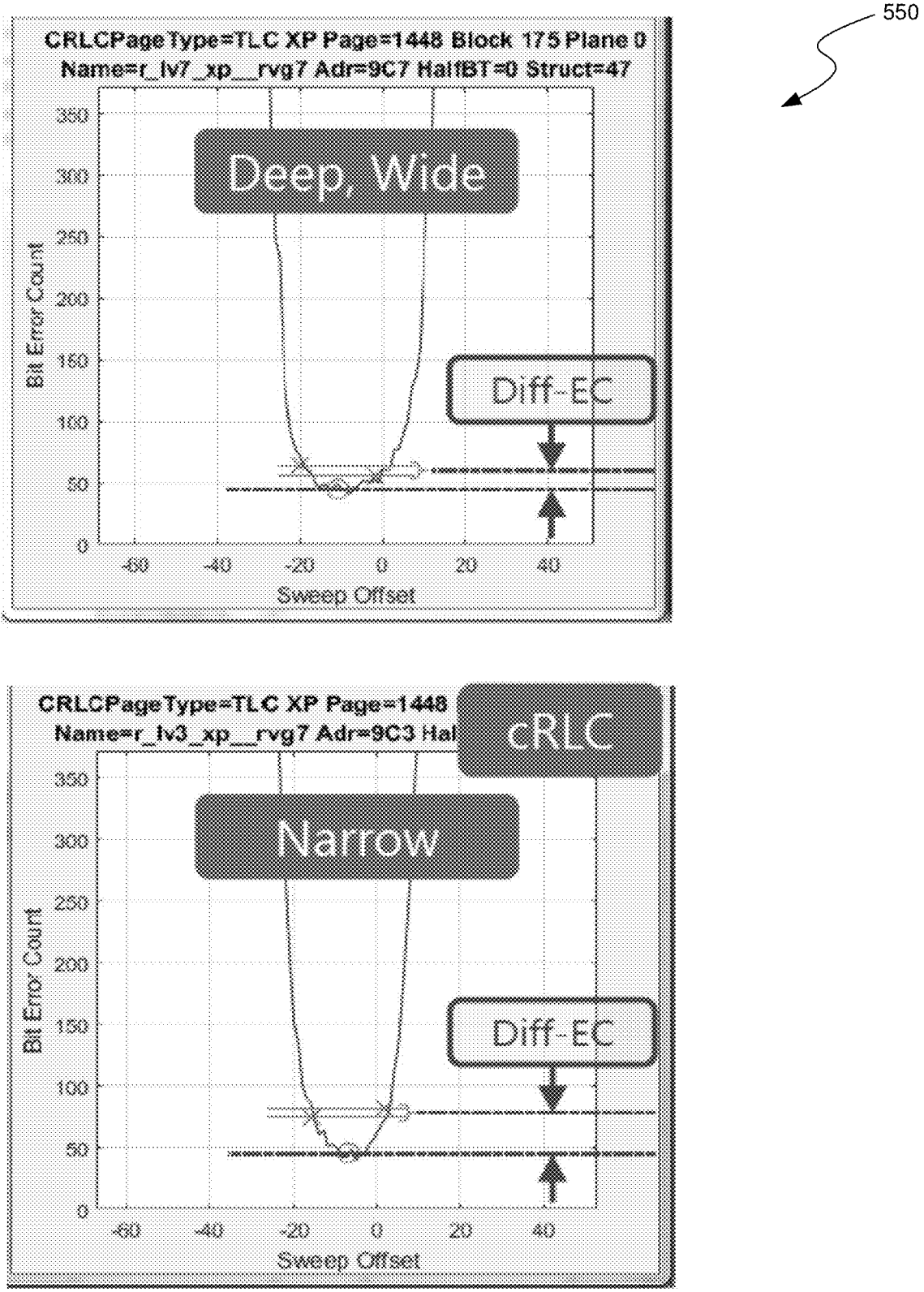
FIG. 5B is a conceptual diagram of data produced during an cRLC procedure, in accordance with some embodiments of the present disclosure.

At block 360, the processing logic can characterize the valley defined by the set of read operations that occurred in the most recent iteration of blocks 354-356 (i.e. the iteration that resulted in convergence). This characterization can include determining a depth and width of the valley and a DiffEC (the distance, on the y-axis, between A) the average, on the y-axis, of the furthest left and furthest right of the read results and B) the y-axis value of the middle of the read results. Examples of characterizations resulting from a cRLC procedure are shown in FIG. 5B.

At block 362, the processing logic can determine whether all the expected valley positions of the memory unit being have been analyzed. If not, the processing logic can proceed to block 364, where it can set the next expected valley position as the current valley for analysis by at blocks 354 and 362. If so, the processing logic can store the results and end. Similarly to method 300, in some implementations, the results can be stored for each valley, for valleys grouped according to identified valley types, or for subsets of the memory unit (e.g. per page) or for subsets of memory units across of a memory component or components of a memory device (e.g. per page, per block, etc.). Where a result is stored for multiple valleys, the result can be generated by aggregating values determined for the multiple valleys, e.g. by taking averages.

Figure 4A:
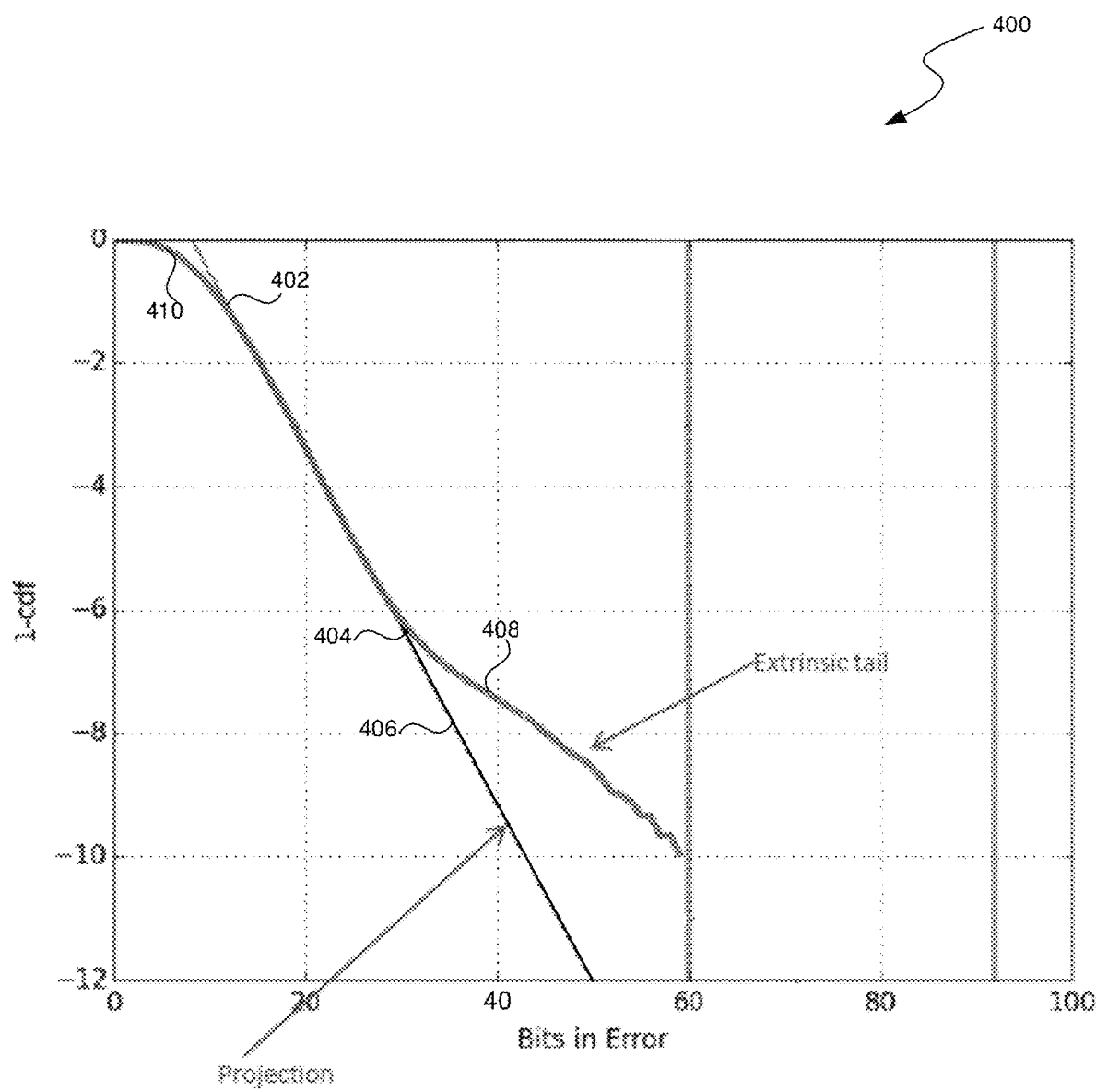
FIG. 4A is a conceptual diagram of Cumulative Distribution Function (CDF)-based data indicating an exceptional memory unit due to an extrinsic tail, in accordance with some embodiments of the present disclosure.

FIG. 4A is a conceptual diagram 400 of example CDF-based data indicating an exceptional memory unit due to an extrinsic tail, in accordance with some embodiments of the present disclosure. An extrinsic tail occurs where a threshold amount of the CDF-based data 410, e.g. from 402 to 404, fits well with a projection 406, but then a subsequent portion of the CDF-based data 410, e.g. at 408, is a threshold amount distant from the projection, and thus has an extrinsic tail.

As used herein a "projection" can be determined in various ways. In some implementations, the projection of the CDF-based data can be a best fit of the CDF-based data to a linear function. In some implementations, other modeling techniques can be used to determine the projection, such as using a function of a different degree, using the average of CDF-based data from other memory populations, or applying a machine learning algorithm to the CDF-based data or data of other memory populations to predict next data points from previous data points of the CDF-based data. In some implementations, the projection can be based on a portion of the CDF-based data.

An extrinsic tail can be identified when there is a sufficient match between the projection of the CDF-based data and the actual CDF-based data by determining if the difference between the two at any point is above a threshold. In some implementations, this determination can be based on a comparison of an average difference of all points within a window. For example, the determination can examine the difference between the projection of the CDF-based data and the actual CDF-based data for each point on the x-axis that are within 5 error units of each other, and determine if the average of these differences is above a threshold. In some implementations, the extrinsic determination may only use points above a particular value, e.g. by excluding points that were excluded for the fitting the projection to the CDF-based data.

When the CDF-based data for a memory population indicates an extrinsic tail, it can indicate that there is a problem with the memory unit. For example, an extrinsic tail can indicate a portion of the memory unit has failed. In example 400, the CDF-based data exhibits an extrinsic tail, thus the corresponding memory unit can be identified as exceptional, e.g. at block 208, to be included in a set of target memory units to be characterized.

Figure 4B:
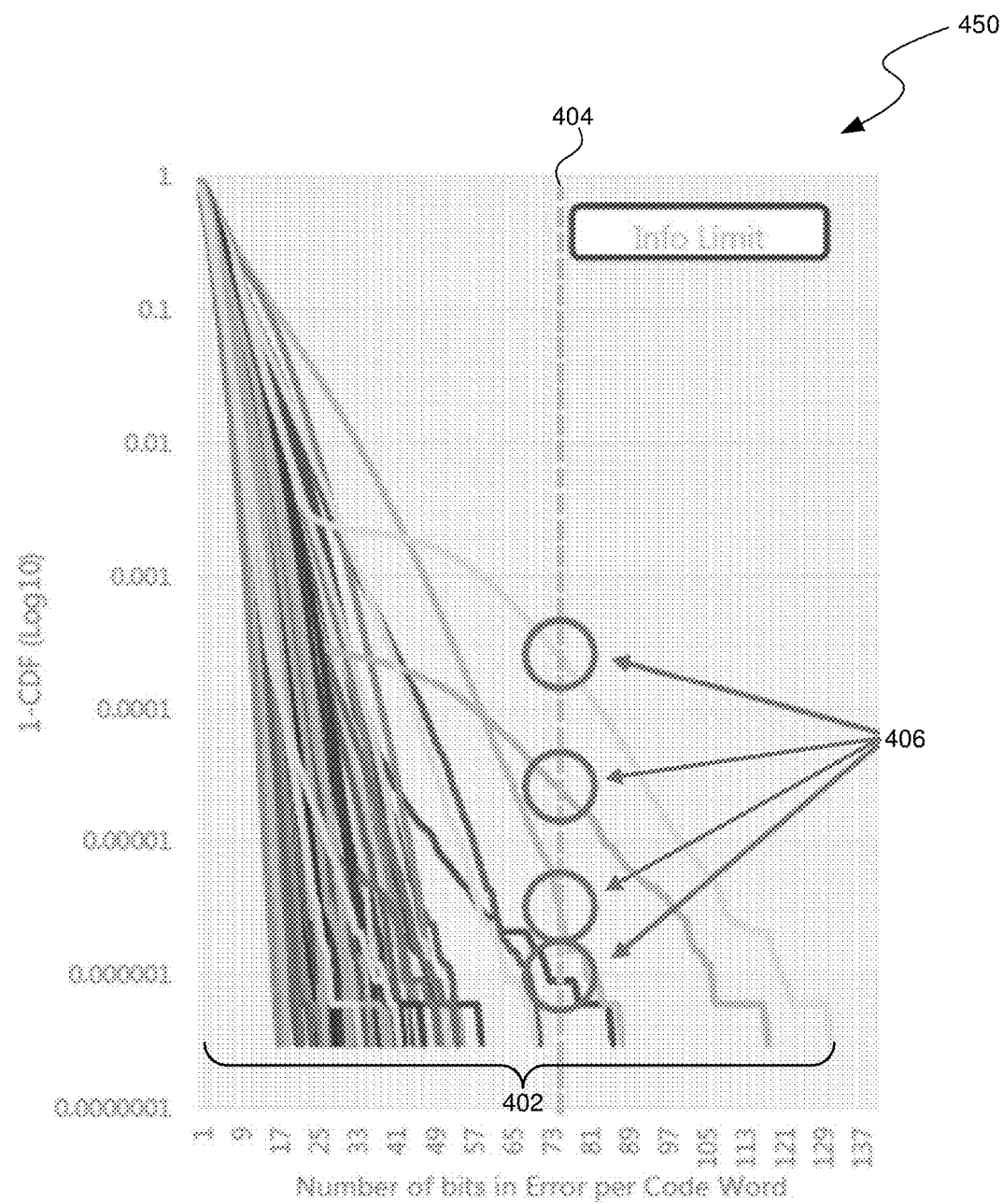
FIG. 4B is a conceptual diagram of CDF-based data indicating several exceptional memory units due to their CDF-based data crossing an info limit threshold, in accordance with some embodiments of the present disclosure.

FIG. 4B is a conceptual diagram 450 of example CDF-based data indicating several exceptional memory units due to their CDF-based data crossing an info limit threshold, in accordance with some embodiments of the present disclosure.

Conceptual diagram 450 includes multiple illustrations of CDF-based data. In this example, each of the lines 402 is a line for a memory. In this example, each memory has been analyzed by generating a histogram of errors per memory item (e.g. code word or other memory item). Each histogram is converted into CDF-based data, e.g. specifying, for a given amount of errors, the frequency of memory items that are expected to have no more than that amount of errors. In this example, the CDF-based data is displayed as 1-CDF, on a logarithmic scale.

An info limit threshold 404 has been set at 75 bits in error per code word. In this example, the info limit threshold was set based on multiple previous analyses of CDF-based data such that, in general, memory units with undesired behavior have CDF-based data that crosses the info limit threshold while memory units without undesired behavior have CDF-based data that does not cross the info limit threshold.

In conceptual diagram 450, there are four instances 406 of memories with CDF-based data that cross the info limit threshold. These memories can be identified as exceptional, e.g. at block 208, to be included in a set of target memory units to be characterized.

Figure 6:
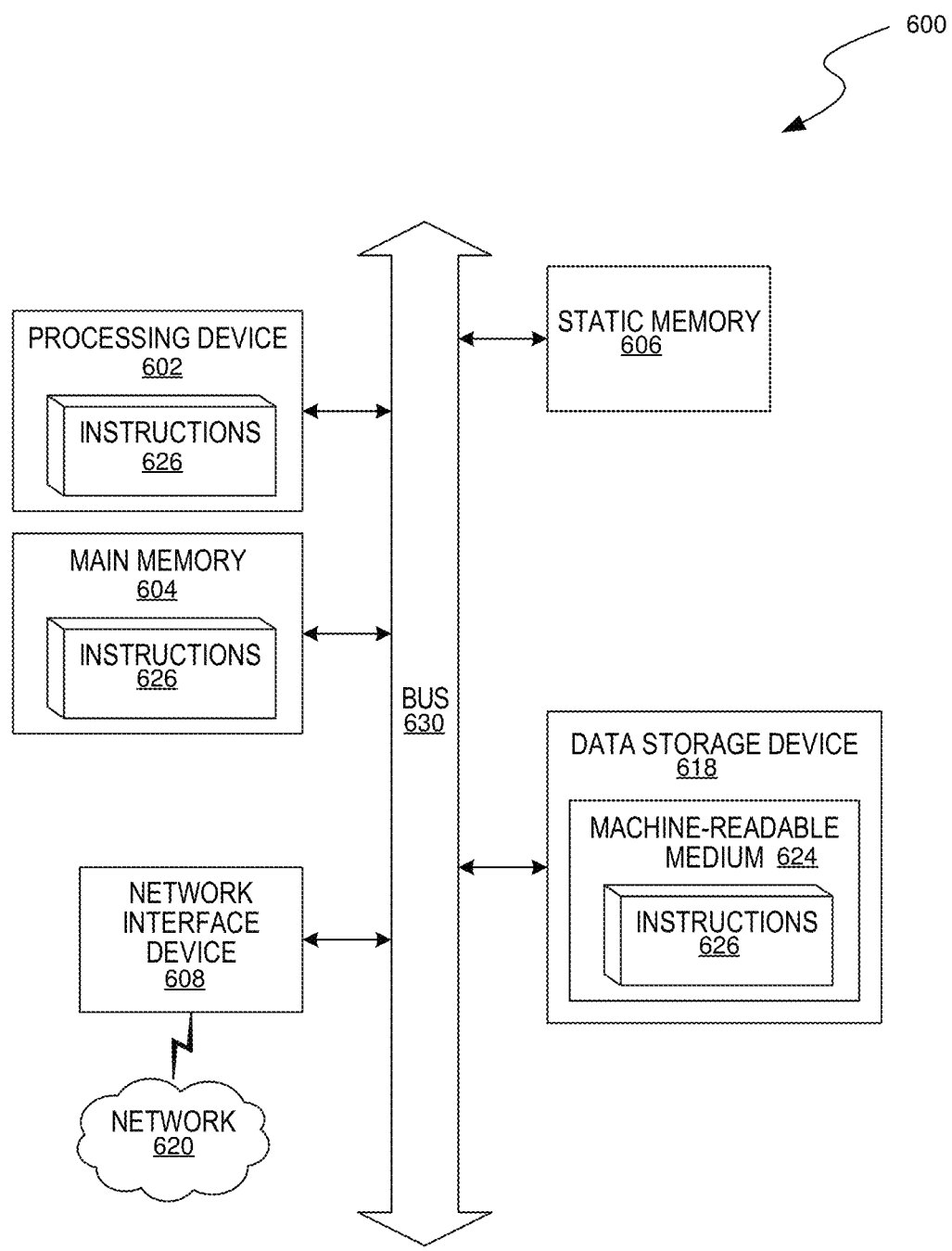
FIG. 6 is a block diagram of an example computer system in accordance with some embodiments of the present disclosure.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the media analysis engine 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a media analysis (e.g., the media analysis engine 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

Those skilled in the art will appreciate that the components and blocks illustrated in FIGS. 1-6 described above, may be altered in a variety of ways. For example, the order of the logic may be rearranged, substeps may be performed in parallel, illustrated logic may be omitted, other logic may be included, etc. In some implementations, one or more of the components described above can execute one or more of the processes described below.

Reference in this specification to "implementations" (e.g. "some implementations," "various implementations," "one implementation," "an implementation," etc.) means that a particular feature, structure, or characteristic described in connection with the implementation is included in at least one implementation of the disclosure. The appearances of these phrases in various places in the specification are not necessarily all referring to the same implementation, nor are separate or alternative implementations mutually exclusive of other implementations. Moreover, various features are described which may be exhibited by some implementations and not by others. Similarly, various requirements are described which may be requirements for some implementations but not for other implementations.

As used herein, being above a threshold means that a value for an item under comparison is above a specified other value, that an item under comparison is among a certain specified number of items with the largest value, or that an item under comparison has a value within a specified top percentage value. As used herein, being below a threshold means that a value for an item under comparison is below a specified other value, that an item under comparison is among a certain specified number of items with the smallest value, or that an item under comparison has a value within a specified bottom percentage value. As used herein, being within a threshold means that a value for an item under comparison is between two specified other values, that an item under comparison is among a middle specified number of items, or that an item under comparison has a value within a middle specified percentage range. Relative terms, such as high or unimportant, when not otherwise defined, can be understood as assigning a value and determining how that value compares to an established threshold. For example, the phrase "selecting a fast connection" can be understood to mean selecting a connection that has a value assigned corresponding to its connection speed that is above a threshold.

As used herein, the word "or" refers to any possible permutation of a set of items. For example, the phrase "A, B, or C" refers to at least one of A, B, C, or any combination thereof, such as any of: A; B; C; A and B; A and C; B and C; A, B, and C; or multiple of any item such as A and A; B, B, and C; A, A, B, C, and C; etc.

Although the subject matter has been described in language specific to structural features and/or methodological acts, it is to be understood that the subject matter defined in the appended claims is not necessarily limited to the specific features or acts described above. Specific embodiments and implementations have been described herein for purposes of illustration, but various modifications can be made without deviating from the scope of the embodiments and implementations. The specific features and acts described above are disclosed as example forms of implementing the claims that follow. Accordingly, the embodiments and implementations are not limited except as by the appended claims.

Any patents, patent applications, and other references noted above are incorporated herein by reference. Aspects can be modified, if necessary, to employ the systems, functions, and concepts of the various references described above to provide yet further implementations. If statements or subject matter in a document incorporated by reference conflicts with statements or subject matter of this application, then this application shall control.

We claim:

1. A method comprising:
for each memory unit of multiple memory units of a memory component of a memory device:
obtaining cumulative distribution function (CDF)-based data for the memory unit;
performing an analysis of the memory unit to determine whether a particular aspect of the CDF-based data for the memory unit exceeds a threshold; and
when the analysis indicates the particular aspect of the CDF-based data for the memory unit exceeds the threshold, adding the memory unit to a set of target memory units;
performing a characterization procedure, for each of the memory units in the set of target memory units, to produce characterization results;
wherein the characterization procedure:
comprises, for each valley position of one or more expected valley positions, performing multiple reads with different initial read voltage thresholds and interpolating, based on histogram results of the multiple reads, a new initial read voltage by: (A) converting the histogram results into a curve fitted to the histogram results; and (B) identifying the new initial read based on the curve; or
1) includes a shift amount and shift direction of a new initial read voltage, as compared to a corresponding expected valley position and 2) comprises:
for each valley position of one or more expected valley positions, performing iterations comprising:
performing one or more reads with different initial read voltage thresholds;
identifying voltage shift characteristics based on results of the performed reads;
identifying a convergence based on a comparison of the voltage shift characteristics to one or more threshold levels; and
determining a shape of a valley corresponding to the valley position based on the results of the performed reads and/or the one or more voltage shift characteristics from one or more of the iterations; and
using the characterization results in a manufacturing process for the memory device or to modify operation of the memory device.

2. The method of claim 1, wherein the memory component is a negative AND (NAND) memory component, and wherein the multiple units are pages of the NAND memory component.

3. The method of claim 1, wherein at least some of the obtained CDF-based data is generated by:
performing multiple reads on a corresponding memory unit, wherein bit error counts per memory item are stored for each read;
generating a histogram of errors per memory item; and
converting the histogram into CDF-based data that specifies, for a given amount of errors, the frequency of code words that are expected to have no more than that amount of errors.

4. The method of claim 1, wherein the threshold is an info limit threshold that specifies an error rate, and wherein performing the analysis for at least one memory unit comprises determining whether any point of the CDF-based data exceeds the info limit threshold.

5. The method of claim 1, wherein the threshold is a variance threshold, and wherein performing the analysis for at least one memory unit comprises determining whether at least a portion of the CDF-based data exhibits an extrinsic tail by:
determining a variance between a projection of the CDF-based data and at least the portion of the CDF-based data; and
identifying the extrinsic tail when the variance is above the variance threshold.

6. The method of claim 1, wherein the characterization procedure is an Auto Read Calibration (ARC) procedure comprising, for each valley position of one or more expected valley positions, performing multiple reads with different initial read voltage thresholds and interpolating, based on histogram results of the multiple reads, a new initial read voltage by:
converting the histogram results into a curve fitted to the histogram results; and
identifying the new initial read voltage as a lowest point on the curve.

7. The method of claim 6, wherein the characterization procedure includes a shift amount and shift direction of the new initial read voltage, as compared to a corresponding expected valley position.

8. The method of claim 1, wherein the characterization procedure is a Continuous Read Level Calibration (cRLC) procedure comprising:
for each valley position of one or more expected valley positions, until a convergence is identified, performing iterations comprising:
performing a set number of reads with different initial read voltage thresholds;
identifying voltage shift characteristics based on results of the performed reads;

identifying convergence when the voltage shift characteristics match, within a specified threshold level, the voltage shift characteristics from one or more previous iterations; and determining a shape of a valley corresponding to the valley position based on the results of the set number of reads and/or the voltage shift characteristics from the last iteration prior to convergence for that valley position.

9. The method of claim 1, wherein using the characterization results in the manufacturing process comprises:

mapping at least one of the characterization result to one or more inferences pertaining to the memory device; and identifying a performance characteristic or corrective action based on the inferences.

10. The method of claim 9, wherein the identifying the performance characteristic or corrective action comprises identifying a corrective action that includes:

for one or more memory units of the memory component, adjusting an initial read voltage threshold; or replacing low performance memory elements.

11. The method of claim 1, wherein using the characterization results to modify the operation of one or more memory units comprises:

reordering error recovery steps;

adjusting a read voltage threshold;

adjusting an amount of voltage change that occurs during a read retry; or any combination thereof.

12. The method of claim 1, wherein using the characterization results to modify the operation of one or more memory units of the memory device comprises:

storing a characterization result for each of multiple expected valley positions; and modifying one or more parameters for read operations for each of the multiple expected valley positions based on the corresponding stored characterization result.

13. A non-transitory computer-readable storage medium comprising instructions that, when executed by one or more processing devices, cause the one or more processing devices to:

for each memory unit, of one or more memory units of one or more memory components in a memory device:

obtain cumulative distribution function (CDF)-based data for the memory unit, wherein at least some of the obtained CDF-based data is generated by:

performing multiple reads on a corresponding memory unit;

generating, based on the multiple reads, a histogram of errors per memory item; and converting the histogram into the CDF-based data that specifies, for a given amount of errors, a frequency of code words that are expected to have no more than that amount of errors;

perform an analysis of the memory unit to determine whether a particular aspect of the CDF-based data for the memory unit exceeds a threshold; and when the analysis indicates the particular aspect of the CDF-based data for the memory unit exceeds the threshold, adding the memory unit to a set of target memory units;

perform a characterization procedure, for each of the memory units in the set of target memory units, to produce characterization results; and use the characterization results in a manufacturing process for the memory device or to modify operation of the memory device.

14. The non-transitory computer-readable storage medium of claim 13, wherein the threshold is an info limit threshold that specifies an error rate, and wherein performing the analysis for at least one memory unit comprises determining whether any point of the CDF-based data exceeds the info limit threshold.

15. The non-transitory computer-readable storage medium of claim 13, wherein the threshold is a variance threshold, and wherein performing the analysis for at least one memory unit comprises:

determining a variance between a projection of the CDF-based data and at least a part of the CDF-based data; and comparing the determined variance to the variance threshold.

16. The non-transitory computer-readable storage medium of claim 13, wherein executing the instructions causes the one or more processing devices to use the characterization results to modify memory operation, the modifying comprising:

reordering error recovery steps;

adjusting a read voltage threshold;

adjusting an amount of voltage change that occurs during a read retry; or any combination thereof.

17. A system comprising:

a memory; and one or more processors that perform operations comprising:

for each memory element of multiple memory elements:

obtaining cumulative distribution function (CDF)-based data for the memory element;

performing an analysis of the memory element to determine whether a particular aspect of the CDF-based data for the memory element exceeds a threshold, wherein the threshold specifies an error rate, and wherein performing the analysis for at least one memory unit comprises determining whether any point of the CDF-based data exceeds the threshold; or wherein performing the analysis for at least one memory unit comprises determining whether at least a portion of the CDF-based data exhibits an extrinsic tail by:

determining a variance between a projection of the CDF-based data and at least the portion of the CDF-based data; and identifying the extrinsic tail when the variance is above the threshold; and when the analysis indicates the particular aspect of the CDF-based data for the memory element exceeds the threshold, adding the memory element to a set of target memory elements;

performing a characterization procedure, for each of the memory elements in the set of target memory elements, to produce characterization results; and using the characterization results in a manufacturing process or to modify memory operation.

18. The system of claim 17, wherein the characterization procedure is a Continuous Read Level Calibration (cRLC) procedure comprising:

for each valley position of one or more expected valley positions until a convergence is identified, performing iterations comprising:

performing a set number of reads with different initial read voltage thresholds;

identifying voltage shift characteristics based on results of the performed reads;

identifying convergence when the voltage shift characteristics match, within a specified threshold level, the voltage shift characteristics from one or more previous iterations; and determining a shape of a valley corresponding to the valley position based on the results of the set number of reads and/or the voltage shift characteristics from the last iteration prior to convergence for that valley position.

19. The system of claim 17, wherein using the characterization results comprises:

storing a characterization result for each valley position of one or more expected valley positions; and modifying one or more parameters for read operations for each expected valley position based on the corresponding stored characterization result.

20. The system of claim 17, wherein at least some of the obtained CDF-based data is generated by:

performing multiple reads on a corresponding memory unit, wherein bit error counts per memory item are stored for each read;

generating a histogram of errors per memory item; and converting the histogram into CDF-based data that specifies, for a given amount of errors, the frequency of code words that are expected to have no more than that amount of errors.

* * * * *